(12) United States Patent
Tobana et al.

(10) Patent No.: US 9,911,621 B2
(45) Date of Patent: Mar. 6, 2018

(54) METHOD FOR PROCESSING TARGET OBJECT

(71) Applicant: TOKYO ELECTRON LIMITED, Tokyo (JP)

(72) Inventors: Toshikatsu Tobana, Miyagi (JP); Gen You, Kumamoto (JP); Soichiro Okada, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/117,052

(22) PCT Filed: Jan. 16, 2015

(86) PCT No.: PCT/JP2015/051029
§ 371 (c)(1),
(2) Date: Aug. 5, 2016

(87) PCT Pub. No.: WO2015/129322
PCT Pub. Date: Sep. 3, 2015

(65) Prior Publication Data
US 2017/0148641 A1 May 25, 2017

(30) Foreign Application Priority Data
Feb. 25, 2014 (JP) .................. 2014-034050

(51) Int. Cl.
*H01L 21/311* (2006.01)
*H01L 21/683* (2006.01)
*H01L 21/02* (2006.01)

(52) U.S. Cl.
CPC .. *H01L 21/31138* (2013.01); *H01L 21/02118* (2013.01); *H01L 21/31144* (2013.01); *H01L 21/6831* (2013.01)

(58) Field of Classification Search
None
See application file for complete search history.

(56) References Cited

U.S. PATENT DOCUMENTS

| | | | | |
|---|---|---|---|---|
| 5,869,401 A | * | 2/1999 | Brunemeier | H01J 37/32862 134/1.1 |
| 6,872,322 B1 | * | 3/2005 | Chow | H01J 37/32862 134/1.1 |

(Continued)

FOREIGN PATENT DOCUMENTS

| | | |
|---|---|---|
| CN | 101645395 A | 2/2010 |
| JP | 7-273093 A | 10/1995 |

(Continued)

OTHER PUBLICATIONS

International Search Report dated Apr. 7, 2015 in PCT/JP2015/051029.

*Primary Examiner* — Allan Olsen
(74) *Attorney, Agent, or Firm* — Rothwell, Figg, Ernst & Manbeck, P.C.

(57) ABSTRACT

This method for processing a target object includes steps ST1 to ST4. The target object has an organic polymer layer and a resist mask on a substrate. In step ST1, the target object is electrostatically attached to an electrostatic chuck in a plasma processing apparatus. In step ST2, the organic polymer layer is etched through the resist mask by means of a plasma of a first gas. In step ST3, the target object is detached from the electrostatic chuck while a plasma of a second gas is generated. In step 4, the resist mask is peeled off. The second gas is either oxygen gas or a mixture of oxygen gas and a rare gas having an atomic weight lower than that of argon gas.

6 Claims, 5 Drawing Sheets

(56) References Cited

U.S. PATENT DOCUMENTS

| | | | | |
|---|---|---|---|---|
| 8,158,523 B2* | 4/2012 | Urbanowicz | ........ | G01N 21/631 216/37 |
| 8,832,916 B2* | 9/2014 | Povolny | .............. | H01L 21/6831 264/335 |
| 2003/0022513 A1* | 1/2003 | Wu | .................... | H01L 21/31116 438/710 |
| 2003/0236004 A1* | 12/2003 | Sung | ................... | H01L 21/6833 438/795 |
| 2005/0066994 A1* | 3/2005 | Biles | ................. | H01J 37/32862 134/1.1 |
| 2011/0097902 A1* | 4/2011 | Singh | ................ | H01L 21/02057 438/710 |
| 2011/0220936 A1 | 9/2011 | Fujimoto et al. | | |
| 2013/0014371 A1* | 1/2013 | Povolny | .............. | H01L 21/6831 29/426.5 |
| 2013/0078576 A1* | 3/2013 | Wu | ....................... | C08F 293/00 430/296 |
| 2014/0273472 A1* | 9/2014 | Somervell | ......... | H01L 21/31144 438/702 |
| 2014/0273514 A1* | 9/2014 | Somervell | ............. | C23C 14/221 438/763 |
| 2015/0048049 A1 | 2/2015 | Nishimura et al. | | |

FOREIGN PATENT DOCUMENTS

| | | | |
|---|---|---|---|
| JP | 8-279487 | A | 10/1996 |
| JP | 2004-14868 | A | 1/2004 |
| JP | 2010-40822 | A | 2/2010 |
| JP | 2011-187787 | A | 9/2011 |
| JP | 2013-201356 | A | 10/2013 |
| JP | 2013-207089 | A | 10/2013 |
| JP | 2014-27228 | A | 2/2014 |

\* cited by examiner

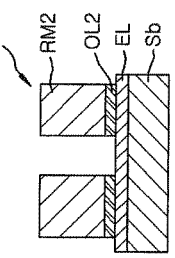
FIG.5A
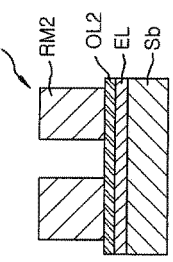
FIG.5B
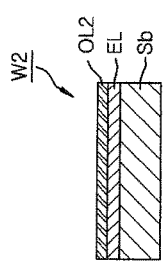
FIG.5C
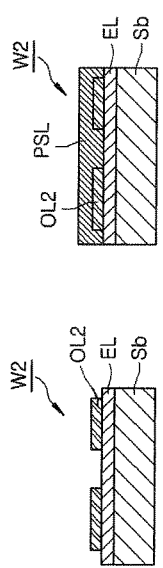
FIG.5D
FIG.5E
FIG.5F
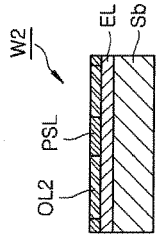
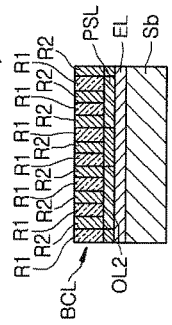
FIG.5G

METHOD FOR PROCESSING TARGET OBJECT

CROSS REFERENCE TO RELATED APPLICATION

This application is a 35 U.S.C. 371 National Phase Entry Application from PCT/JP2015/051029, filed Jan. 16, 2015, which claims priority to Japanese Patent Application No. 2014-034050, filed Feb. 25, 2014, the disclosures of which are incorporated herein in their entirety by reference.

FIELD OF THE INVENTION

The present invention relates to a method for processing a target object.

BACKGROUND OF THE INVENTION

In order to realize miniaturization of devices such as semiconductor devices, a technique for forming a fine pattern by using a self-assembled material that self-assembles into an orderly pattern, i.e., a self-assembly technique, attracts attention as an alternative technique for a conventional lithography technique.

In the self-assembly technique, a target object is prepared by forming an organic polymer layer on a substrate and then forming a resist mask on the organic polymer layer. Next, the target object is exposed to a plasma generated in a plasma processing apparatus. Accordingly, the organic polymer layer is etched. Then, a resist mask is peeled off. Thereafter, a self-assemblable block copolymer layer is formed on the target object and a process that allows self-assembly of two polymers contained in the block copolymer layer is performed. As a consequence, two regions are formed on the block polymer layer. Lastly, a pattern is formed by selectively etching one of the two regions of the block polymer layer.

In the self-assembly technique, in order to peel off the resist mask, the target object is detached from an electrostatic chuck of the plasma processing apparatus after the etching of organic polymer layer and then transferred from the plasma processing apparatus to another apparatus.

When the target object is detached from the electrostatic chuck, it is general that a plasma of a rare gas such as argon gas or the like is generated in the processing chamber of the plasma processing apparatus. By destaticizing the target object while the target object is exposed to the plasma of the rare gas, it is possible to detach the target object from the electrostatic chuck while reducing stress applied to the target object. Such destaticization is disclosed in Japanese Patent Application Publication No. 1995-273093.

However, when the target object is destaticized in the plasma of the rare gas, impurities are adhered to the organic polymer layer. The impurities contain a substrate material, e.g., silicon. The impurities remain as residue even after the resist mask is peeled off. The organic polymer layer serves as a base layer for a block copolymer layer to be described later. Thus, if the block copolymer layer is etched in a state where the residue remains on the organic polymer layer, a pattern different from an initial pattern is formed.

Therefore, when the target object is processed, it is desired to suppress the generation of residue due to destaticization of the target object from the electrostatic chuck of the plasma processing apparatus.

SUMMARY OF THE INVENTION

In accordance with an aspect, there is provided a method for processing a target object. In a first step, the target object is electrostatically attracted on an electrostatic chuck provided in a processing chamber of a plasma processing apparatus. The target object includes a substrate containing silicon, an organic polymer layer formed on the substrate, and a resist mask formed on the organic polymer layer. In a second step, the target object is exposed through the resist mask to a plasma of a first gas generated in the processing chamber so that the organic polymer layer is etched. In a third step, after the second step, the target object is detached from the electrostatic chuck while a plasma of a second gas is generated in the processing chamber. In a fourth step, after the third step, the resist mask is of peeled off. In a fifth step, after the fourth step, a self-assemblable block copolymer layer including a first polymer and a second polymer is formed on the target object. In a sixth step, the target object is processed such that a first region including the first polymer and a second region including the second polymer are formed in the block copolymer layer. In a seventh step, after the sixth step, the second region is etched by using the plasma processing apparatus. The second gas is oxygen gas or a gaseous mixture of oxygen gas and a rare gas having an atomic weight lower than an atomic weight of argon gas.

In the above-described method, the target object is detached from the electrostatic chuck in the plasma of the oxygen gas or the gaseous mixture of the oxygen gas and a rare gas having an atomic weight lower than that of argon gas. Therefore, the generation of residue on the organic polymer layer can be suppressed. Further, in the above-described method, the block copolymer layer is formed by using as a base a polymer layer having a reduced amount of residue, so that a pattern of the block copolymer layer can be formed with high accuracy block copolymer.

The organic polymer layer may contain polystyrene, or a random copolymer of styrene and methyl methacrylate.

EFFECT OF THE INVENTION

As described above, with respect to processing the target object, it is possible to suppress the generation of residue caused by destaticization of the target object from the electrostatic chuck of the plasma processing apparatus.

BRIEF DESCRIPTION OF THE DRAWINGS

FIGS. 5A to 5G are cross sectional views illustrating products formed by steps of the method shown in FIG. 4.

DETAILED DESCRIPTION OF THE EMBODIMENTS

Figure 1:
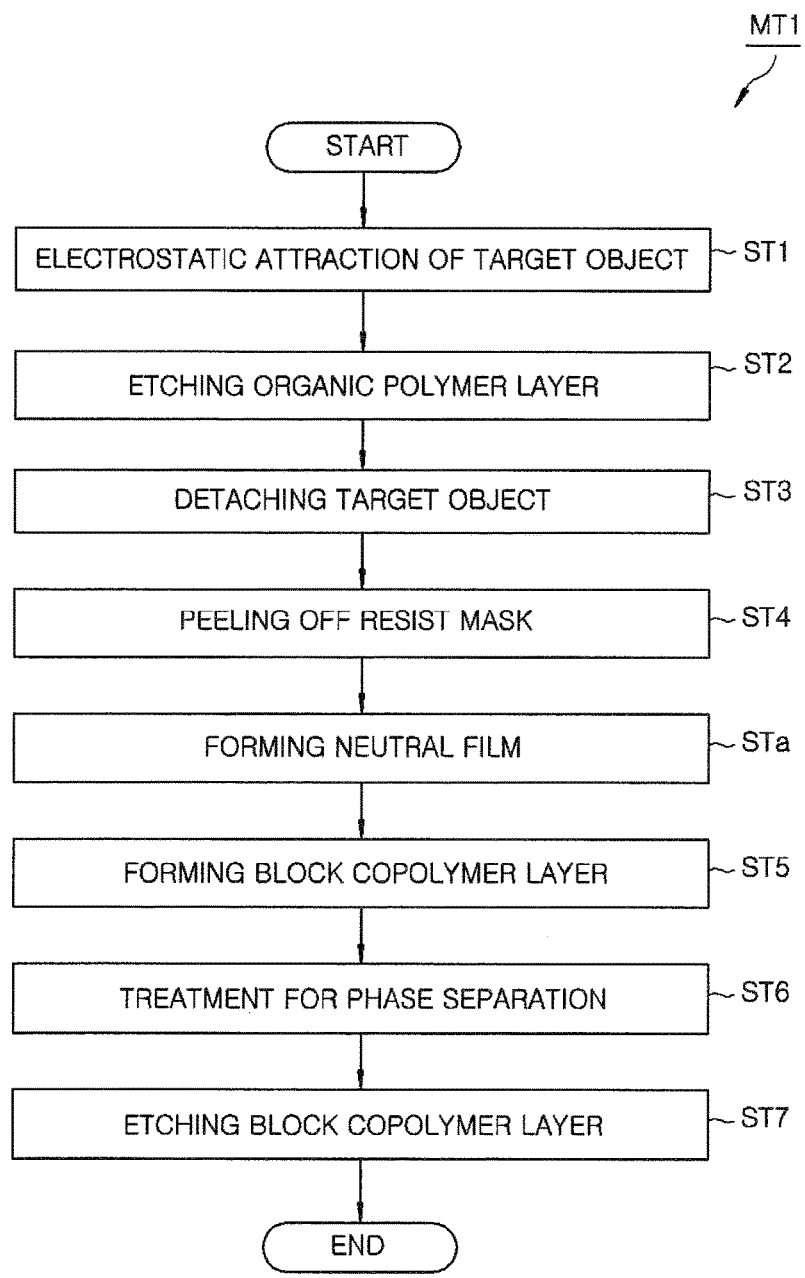
FIG. 1 is a flowchart illustrating a method for processing a target object according to an embodiment.

Hereinafter, embodiments will be described in detail with reference to the accompanying drawings. Further, like reference numerals will be used for like or corresponding parts throughout the respective drawings.

FIG. 1 is a flowchart illustrating a method for processing a target object according to an embodiment. A method MT1 shown in FIG. 1 includes steps ST1 to ST7. The method MT1 further includes a step STa. FIGS. 2A to 2G are a cross sectional views illustrating products formed by steps of the method shown in FIG. 1. Hereinafter, FIGS. 2A to 2G will be referred to in addition to FIG. 1.

Figure 2A:
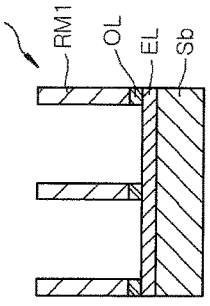
FIGS. 2A to 2G are cross sectional views illustrating products formed by steps of the method shown in FIG. 1.

The target object (hereinafter, referred to as "wafer") as an object to be processed in the method shown in FIG. 1 initially has a cross sectional structure shown in FIG. 2A. The wafer W shown in FIG. 2A includes a substrate Sb, an etching target layer EL, and an organic polymer layer OL. The substrate Sb is made of, e.g., silicon. The etching target layer EL is formed on the substrate Sb. The etching target layer EL contains silicon. The etching target layer EL may be, e.g., a SiN layer, a silicon oxide layer, or a silicon-containing resist layer.

The organic polymer layer OL is formed on the etching target layer EL. The organic polymer layer OL is made of, e.g., polystyrene. For example, the organic polymer layer OL is obtained by forming a film by coating, e.g., a diluted polystyrene solution, on the etching target layer EL by a spin coating method or the like and then performing heat treatment on the wafer that has been subjected to the film formation so that cross-linking reaction occurs. A temperature of the heat treatment is, e.g., 200° C.

Figure 2B:
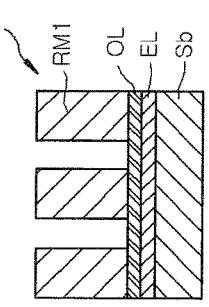

Next, a resist material is coated on the organic polymer layer OL. In one example, the resist material is a positive-tone resist. By patterning the resist material by using a photolithography technique, a resist mask RM1 is formed on the organic polymer layer OL as shown in FIG. 2B.

Figure 3:
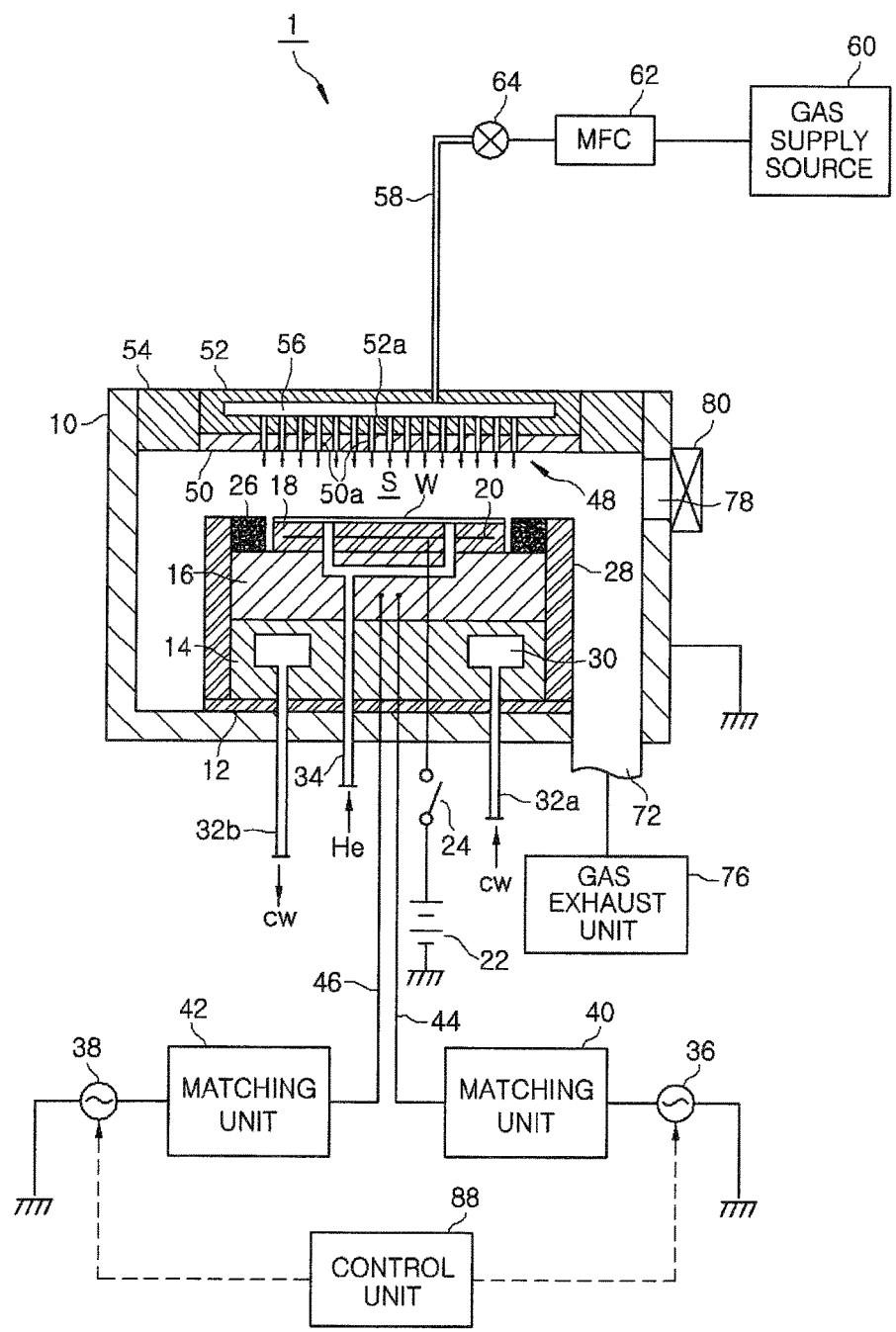
FIG. 3 schematically shows a plasma processing apparatus according to an embodiment.

First, a step ST1 (first step) of the method MT1 is performed on the wafer W thus prepared. In the step ST1, the wafer W is transferred into the plasma processing apparatus and electrostatically attracted on the electrostatic chuck. FIG. 3 schematically shows an example of a plasma processing apparatus that can be used for implementing the method MT1. A plasma processing apparatus 1 shown in FIG. 3 is a capacitively coupled parallel plate type plasma processing apparatus and includes a substantially cylindrical processing chamber 10. The processing chamber 10 is grounded. An inner surface of the processing chamber 10 is a surface which has been subjected to alumite treatment (anodic oxidation treatment).

A cylindrical susceptor support 14 is provided on a bottom portion of the processing chamber 10 through an insulating plate 12 such as ceramic or the like. A susceptor 16 made of, e.g., aluminum, is provided on the susceptor support 14.

An electrostatic chuck 18 for holding the wafer W by electrostatic attraction force is provided on the top surface of the susceptor 16. The electrostatic chuck 18 has a structure in which a chuck electrode 20 made of a conductive film is embedded between a pair of insulating layers or insulating sheets. A DC power supply 22 is electrically connected to the electrode 20 through a switch 24. In the plasma processing apparatus 1, the wafer W can be attracted and held on the electrostatic chuck 18 by electrostatic force generated by a DC voltage applied from the DC power supply 22.

A focus ring 26 for improving in-plane etching uniformity is provided on the susceptor 16 to surround the electrostatic chuck 18. The focus ring 26 is made of, e.g., silicon. A cylindrical inner wall member 28 made of, e.g., quartz, is attached to side surfaces of the susceptor 16 and the susceptor support 14.

The susceptor support 14 has therein a coolant channel 30. The coolant channel 30 extends in, e.g., an annular shape, inside the susceptor support 14. A coolant cw, e.g., cooling water, having a predetermined temperature is supplied from an external chiller unit into the coolant channel 30 and circulates through lines 32a and 32b. In the plasma processing apparatus 1, a temperature of the wafer W on the susceptor 16 is controlled by controlling the temperature of the coolant cw. A heat transfer gas, e.g., He gas, from a heat transfer gas supply unit (not shown) is supplied to a space between the top surface of the electrostatic chuck 18 and the backside of the wafer W through a gas supply line 34.

A first high frequency power supply 36 for plasma generation and a second high frequency power supply 38 for ion attraction are electrically connected to the susceptor 16 through the matching units 40 and 42 and power feed rods 44 and 46, respectively.

The first high frequency power supply 36 generates a power of a first frequency suitable for plasma generation, e.g., 40 MHz. The first frequency may be 60 MHz or 100 MHz. The second high frequency power supply 38 generates a power of a second frequency that is relatively low and suitable for attraction of ions in the plasma to the wafer W on the susceptor 16, e.g., 13 MHz.

An upper electrode 48 is provided above the susceptor 16 to face the susceptor in parallel. The upper electrode 48 includes an electrode plate 50, and an electrode holding body 52 for detachably holding the electrode plate 50. The electrode plate 50 has a plurality of gas holes 50a. The electrode plate 50 may be made of a semiconductor material, e.g., Si and SiC. The electrode holding body 52 is made of, e.g., aluminum, and has an alumite-treated surface. The electrode plate 50 and the electrode holding body 52 are attached to an upper portion of the processing chamber 10 through a ring-shaped insulator 54. The insulator 54 may be made of, e.g., alumina. A plasma generation space, i.e., a processing space S, is formed between the upper electrode 48 and the susceptor 16.

The electrode holding body 52 has therein a gas buffer space 56. The electrode holding body 52 has a plurality of gas vent holes 52a that allows communication between the gas buffer space 56 and the gas holes 50a of the electrode plate 50. A gas supply source 60 is connected to the gas buffer space 56 through a gas supply line 58. A mass flow controller (MFC) 62 and an opening/closing valve 64 are installed in the gas supply line 58. When a processing gas is introduced into the gas buffer space 56 from the gas supply source 60, the processing gas is injected in a shower form into the processing space S toward the wafer W on the susceptor 16 through the gas holes 50a of the electrode plate 50. The upper electrode 48 also serves as a shower head for supplying the processing gas into the processing space S.

An annular space formed between the cylindrical inner wall member 28 and a sidewall of the processing chamber 10 serves as a gas exhaust space. A gas exhaust port 72 of the processing chamber 10 is formed at a bottom of the gas exhaust space. A gas exhaust unit 76 is connected to the gas exhaust port 72. The gas exhaust unit 76 includes a vacuum pump such as a turbo molecular pump or the like and is configured to decrease a pressure in the processing chamber 10, especially the processing space S, to a predetermined vacuum level. A gate valve 80 for opening/closing a loading/unloading port 78 for the wafer W is attached to the sidewall of the processing chamber 10.

The control unit 88 includes a CPU (Central Processing Unit), a ROM (Read Only Memory), and a RAM (Random Access Memory). The CPU controls execution of processes based on various recipes stored in, e.g., the RAM.

In the case of processing the wafer W in the plasma processing apparatus 1, the gate valve 80 is first opened and the wafer W held on a transfer arm is loaded into the processing chamber 10. Then, the wafer W is mounted on the electrostatic chuck 18. After the wafer W is loaded into the processing chamber 10, the gate valve 80 is closed and the processing gas is introduced into the processing chamber from the gas supply source 60 at a predetermined flow rate and a predetermined flow rate ratio. A pressure in the processing chamber 10 is decreased to a preset level by the gas exhaust unit 76. Further, a high frequency power is supplied from the first high frequency power supply 36 to the susceptor 16 and, if necessary, a high frequency bias power is supplied from the second high frequency power supply 38 to the susceptor 16. Accordingly, the processing gas introduced in a shower form from the shower head is excited, thereby generating a plasma. Then, the wafer W is processed by active species such as radicals or ions in the plasma.

Figure 2C:
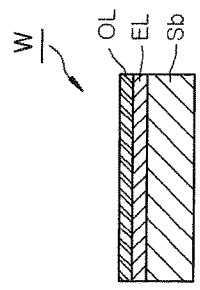

Referring back to FIGS. 1 and 2A to 2G, a step ST2 (second step) of the method MT1 is executed after the wafer W is electrostatically attracted on the electrostatic chuck in the step ST1. In the step ST2, the organic polymer layer OL is etched as shown in FIG. 2C. In the step ST2, a plasma of a first gas is generated in the plasma processing apparatus 1. In the step ST2, a portion of the organic polymer layer OL which is not covered by the resist mask RM1 is etched by the exposure of the wafer W to the plasma.

In the case of executing the step ST2 by using the plasma processing apparatus 1, the first gas is supplied from the gas supply source 60 into the processing chamber 10, and a pressure in the processing chamber 10 is decreased to a preset level by the gas exhaust unit 76. Further, a high frequency power is supplied from the first high frequency power supply 36 to the susceptor 16. If necessary, a high frequency bias power may be supplied from the second high frequency power supply 38 to the susceptor 16. The first gas used in step ST2 is a processing gas for etching the organic polymer layer OL and thus may contain oxygen. In one example, the first gas is oxygen gas ($O_2$ gas). The first gas may contain nitrogen gas and hydrogen gas. The first gas may further contain neon gas and helium gas.

Next, a step ST3 (third step) of the method MT1 is executed. In the step ST3, the wafer W is detached from the electrostatic chuck in order to execute a step ST4 (fourth step) to be described below in another apparatus. In the step ST3, a plasma of the second gas is generated. The second gas is oxygen gas ($O_2$ gas) or a gaseous mixture of oxygen gas and a rare gas having an atomic weight lower than that of argon, e.g., He gas or Ne gas. In the step ST3, the wafer W is detached while being exposed to the plasma of the second gas. Accordingly, it is possible to destaticize the wafer W and reduce stress that may be applied to the wafer W during the detaching operation.

In the case of executing the step ST3 by using the plasma processing apparatus 1, the second gas is supplied from the gas supply source 60 into the processing chamber 10 and a pressure in the processing chamber 10 is decreased to a preset level by the gas exhaust unit 76. Further, a high frequency power is supplied from the first high frequency power supply 36 to the susceptor 16. In the step ST3, a high frequency bias power from the second high frequency power supply 38 is not supplied to the susceptor 16. Moreover, in the step ST3, the application of a DC voltage to the electrostatic chuck 18 is stopped. As a consequence, it is possible to destaticize the wafer W and detach the wafer W from the electrostatic chuck 18.

Figure 2D:
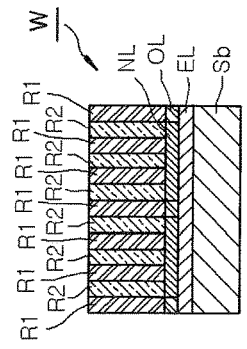

In the method MT1, next, the wafer W is transferred to another apparatus different from the plasma processing apparatus 1 and the step ST4 is executed in the corresponding apparatus. In the step ST4, the resist mask RM1 is peeled off as shown in FIG. 2D. The resist mask RM1 is peeled off by using a strong alkaline solution, e.g., butyl acetate, dimethyl sulfoxide (DMSO) solvent, or the like.

Figure 2E:
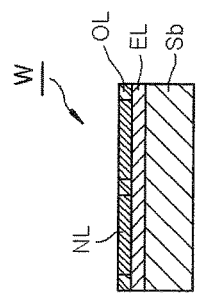

Next, a step STa of the method MT1 is executed. In the step STa, a neutral film NL is formed as shown in FIG. 2E. The neutral film NL is formed in openings of the organic polymer layer OL and on the etching target layer EL. The neutral film NL is, e.g., a random copolymer of styrene and methyl methacrylate. The neutral film NL is formed by coating a raw material on the wafer W by a spin coating method or the like, performing heat treatment on the wafer W coated with the raw material, and then removing an excessively formed portion of the film. A temperature for the heat treatment is, e.g., 200° C. The excessively formed portion of the film can be removed by, e.g., toluene.

Next, a step ST5 (fifth step) of the method MT1 is executed. In the fifth step (ST5), a block copolymer layer is formed on the organic polymer layer OL and the neutral film NL. The block copolymer is a self-assembled block copolymer and includes a first polymer and a second polymer. The block copolymer is, e.g., polystyrene-block-poly (methyl methacrylate) (PS-b-PMMA). PS-b-PMMA contains polystyrene PS as the first polymer and poly methyl methacrylate PMMA as the second polymer. The block copolymer layer may be formed by various methods, e.g., a spin coating method and the like.

Figure 2F:
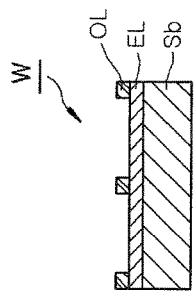

Next, a step ST6 (sixth step) of the method MT1 is executed. In the step ST6, treatment for phase separation by self-assembly of the block copolymer layer is carried out. As a consequence, the phase separation of the block copolymer layer BCL occurs as shown in FIG. 2F. In one embodiment, a length of the first polymer PS and a length of the second polymer PMMA are substantially the same, and the interaction (repulsive force) between the two polymers is substantially the same. Therefore, the first polymer PS and the second polymer PMMA are self-assembled and phase-separated in a line shape. Accordingly, as shown in FIG. 2F, the first polymer PS forms line-shaped first regions R1 and the second polymer PMMS forms line-shaped second regions R2 between the first regions. The organic polymer layer OL is referred to as a non-polar film and has good compatibility with polystyrene PS. Therefore, the first region R1 tends to be formed on the organic polymer layer OL. Further, a temperature of the heat treatment for the phase separation is within a range from 200° C. to 300° C., for example.

Figure 2G:
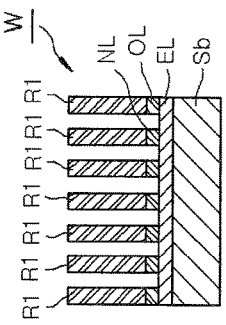

Lastly, a step ST7 (seventh step) of the method MT1 is executed. In the step ST7, the second region R2 is selectively etched by exposing the wafer W to a plasma of a processing gas. Further, in the step ST7, the neutral film NL directly under the second region R2 is also etched. Accordingly, a pattern shown in FIG. 2G is formed on the etching target layer EL.

In the case of executing the step ST7 by using the plasma processing apparatus 1, the processing gas is supplied from the gas supply source 60 into the processing chamber 10, and a pressure in the processing chamber 10 is decreased to a preset level by the gas exhaust unit 76. Further, a high frequency power is supplied from the first high frequency power supply 36 to the susceptor 16. In the step ST7, if necessary, a high frequency bias power may be supplied from the second high frequency power supply 38 to the susceptor 16. The processing gas used in the step ST7 is a processing gas for etching the second region R2 including the second polymer PMMA and the neutral film NL formed directly thereunder and thus may contain oxygen gas. The processing gas may further contain a rare gas such as argon gas, or an inert gas such as nitrogen gas.

In the above-described method MT1, the wafer W is destaticized by exposure to the plasma of the second gas during the detaching operation of the wafer W in the step ST3. The second gas is oxygen gas or a gaseous mixture of oxygen gas and a rare gas having an atomic weight lower than that of argon. When the wafer W is destaticized by exposure to the plasma of the second gas, the damage to the etching target layer EL is reduced compared to the case of using a plasma of a rare gas such as argon gas having a relatively high atomic weight. Therefore, in the method MT1, it is possible to suppress adhesion of impurities from the etching target layer EL onto the organic polymer layer OL during the destaticizing operation. Accordingly, in the method MT1, the generation of residue on the organic polymer layer OL can be suppressed. Further, since the block copolymer layer BCL is formed while using as a base the organic polymer layer OL having a reduced amount of residue, the pattern can be formed with high accuracy by the block copolymer layer BCL.

Figure 4:
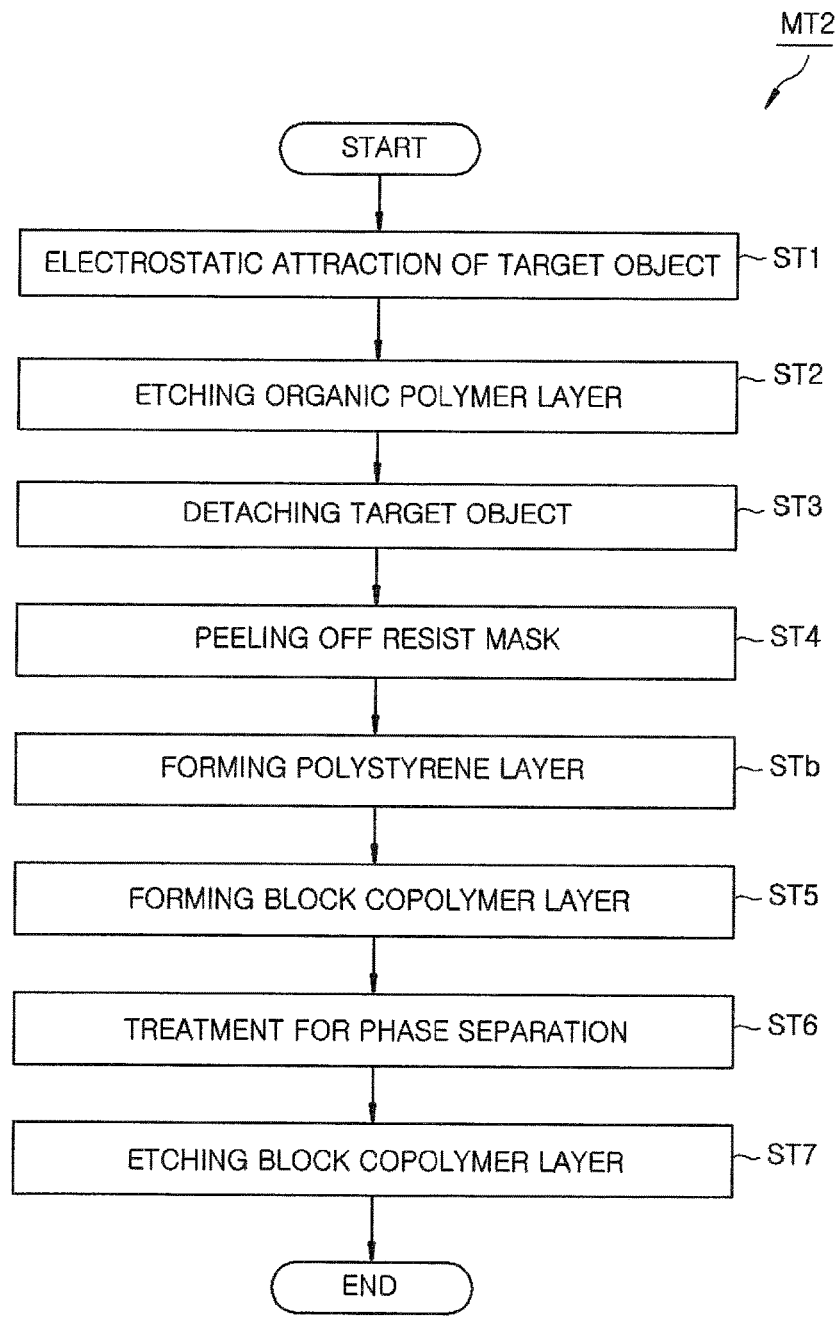
FIG. 4 is a flowchart illustrating a method for processing a target object according to another embodiment.

Hereinafter, another embodiment will be described. FIG. 4 is a flowchart illustrating a method for processing a target object according to another embodiment. FIGS. 5A to 5G are cross sectional views illustrating products produced by steps of the method shown in FIG. 4.

A wafer W2 as a processing target of a method MT2 shown in FIG. 4 initially has a cross sectional structure shown in FIG. 5A. Specifically, the wafer W2 includes a substrate Sb, an etching target layer EL, and an organic polymer layer OL2. The substrate Sb and the etching target layer EL of the wafer W2 are the same as the substrate Sb and the etching target layer EL of the wafer W. The organic polymer layer OL2 is formed on the etching target layer EL. The organic polymer layer OL2 is made of the same material as that of the neutral film NL of the wafer W. The organic polymer layer OL2 and the neutral film NL are formed in the same manner.

Next, a resist material is coated on the organic polymer layer OL2. The resist material is, e.g., a negative-tone resist. By patterning the resist material by using a photolithography technique, the resist mask RM2 is formed on the organic polymer layer OL2 as shown in FIG. 5B.

In a step ST1 of the method MT2, the wafer W2 thus prepared is electrostatically attracted on the electrostatic chuck of the plasma processing apparatus. The step ST1 is the same as the step ST1 of the method MT1 and can be executed by using the plasma processing apparatus 1.

Next, a step ST2 (second step) of the method MT2 is executed. In the step ST2, the organic polymer layer OL2 is etched and the wafer W2 has a state shown in FIG. 5C. The processing condition for etching in the step ST2 is the same as the processing condition of the step ST2 of the method MT1. Then, a step ST3 of the method MT2 is executed as in the method MT1, so that the wafer W2 is detached from the electrostatic chuck and transferred to another apparatus.

A step ST4 of the method MT2 is executed as in the method MT1, so that the resist mask RM2 is peeled off. In the step ST4 of the method MT2, the resist mask RM2 is peeled off by using, e.g., 2.38% tetramethylammonium hydroxide aqueous solution or strong alkaline solution of dimethyl sulfoxide solvent.

Next, a step STb of the method MT2 is executed. In the step STb, a polystyrene layer PSL is formed. Specifically, in the step STb, a raw material is coated on the etching target layer EL and the organic polymer layer OL2 by a spin coating method or the like. Next, the heat treatment is performed on the wafer W2. A temperature of the heat treatment is, e.g., 200° C. As a consequence, the wafer W2 has a state shown in FIG. 5E. Then, an excessive portion of the polystyrene layer PSL is removed. As a result, the wafer W2 has a state shown in FIG. 5F. The excessive portion of the polystyrene layer PSL is removed by using, e.g., toluene.

Thereafter, a step ST5 of the method MT2 is performed on the wafer W2 shown in FIG. 5F. Upon completion of the step ST5, a step ST6 of the method MT2 is executed, so that the wafer W2 has a state shown in FIG. 5G. Then, a step ST7 is executed upon completion of the step ST6. The steps ST5 to ST7 of the method MT2 are the same as the steps ST5 to ST7 of the method MT1.

In the method MT2, the wafer W is destaticized by exposure to the plasma of the second gas during the detachment operation of the wafer W2 in the step ST3. Therefore, in the method MT2, the generation of residue on the organic polymer layer OL2 is suppressed. Further, the block copolymer layer BCL is formed by using as a base the organic polymer layer OL2 having a reduced amount of residue, so that a pattern can be formed with high accuracy by the block copolymer layer BCL.

While the embodiments have been described, various modifications can be made without being limited to the above-described embodiments. For example, the plasma processing apparatus is not limited to a capacitively coupled plasma processing apparatus. For example, in the above-described steps, it is also possible to use an inductively coupled plasma processing apparatus, or a plasma processing apparatus using as a plasma source a surface wave such as a microwave.

DESCRIPTION OF REFERENCE NUMERALS

1: plasma processing apparatus
10: processing chamber
16: susceptor
18: electrostatic chuck
36: first high frequency power supply
38: second high frequency power supply
48: upper electrode
W: wafer
Sb: substrate
EL: etching target layer
OL: organic polymer layer
RM1: resist mask
NL: neutral film
BCL: block polymer layer
R1: first region
R2: second region
W2: wafer
OL2: organic polymer layer
RM2: resist mask
PSL: polystyrene layer

What is claimed is:

1. A method for processing a target object, comprising:
  a first step of electrostatically attracting the target object on an electrostatic chuck provided in a processing chamber of a plasma processing apparatus, the target object including a substrate containing silicon, an organic polymer layer formed on the substrate, and a resist mask formed on the organic polymer layer;
  a second step of exposing the target object through the resist mask to a plasma of a first gas generated in the processing chamber so that the organic polymer layer is etched;
  a third step, after the second step, of detaching the target object from the electrostatic chuck while generating a plasma of a second gas in the processing chamber;

a fourth step, after the third step, of peeling off the resist mask;

a fifth step, after the fourth step, of forming on the target object a self-assemblable block copolymer layer including a first polymer and a second polymer;

a sixth step of processing the target object such that a first region including the first polymer and a second region including the second polymer are formed in the block copolymer layer; and a seventh step, after the sixth step, of etching the second region by using the plasma processing apparatus, wherein the second gas is oxygen gas or a gaseous mixture of oxygen gas and a rare gas having an atomic weight lower than an atomic weight of argon gas.

2. The method of claim 1, wherein the organic polymer layer contains polystyrene, or a random copolymer of styrene and methyl methacrylate.

3. The method of claim 1, wherein the second step and the seventh step are performed in the same processing chamber.

4. The method of claim 1, wherein the target object is transferred to another apparatus prior to the fourth step.

5. A method for processing a target object, comprising:

a first step of electrostatically attracting the target object on an electrostatic chuck provided in a processing chamber of a plasma processing apparatus, the target object including a substrate containing silicon, an etching target layer formed on the substrate, an organic polymer layer formed on the etching target layer, and a resist mask formed on the organic polymer layer;

a second step of exposing the target object through the resist mask to a plasma of a first gas generated in the processing chamber so that the organic polymer layer is etched;

a third step, after the second step, of detaching the target object from the electrostatic chuck while generating a plasma of a second gas in the processing chamber;

a fourth step, after the third step, of peeling off the resist mask;

a step, after the fourth step, of forming a neutral film in an opening of the organic polymer layer and on the etching target layer;

a fifth step, after the step of forming a neutral film, of forming on the organic polymer layer and the neutral film a self-assemblable block copolymer layer including a first polymer and a second polymer;

a sixth step of processing the target object such that a first region including the first polymer and a second region including the second polymer are formed in the block copolymer layer; and a seventh step, after the sixth step, of etching the second region and a portion of the neutral film which is directly below the second region, by using the plasma processing apparatus, wherein the second gas is oxygen gas or a gaseous mixture of oxygen gas and a rare gas having an atomic weight lower than an atomic weight of argon gas.

6. The method of claim 5, wherein the organic polymer layer contains polystyrene, or a random copolymer of styrene and methyl methacrylate.

* * * * *